United States Patent
Chen et al.

(10) Patent No.: US 7,732,759 B2
(45) Date of Patent: *Jun. 8, 2010

(54) MULTI-PLASMA NEUTRAL BEAM SOURCE AND METHOD OF OPERATING

(75) Inventors: Lee Chen, Cedar Creek, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 144 days.

This patent is subject to a terminal disclaimer.

(21) Appl. No.: 12/126,456

(22) Filed: May 23, 2008

(65) Prior Publication Data

US 2009/0289179 A1    Nov. 26, 2009

(51) Int. Cl.
*H05H 3/06* (2006.01)
*H05H 3/00* (2006.01)

(52) U.S. Cl. ............. 250/251; 315/111.81; 315/111.21; 216/67; 356/316

(58) Field of Classification Search ............. 250/251; 315/111.21, 111.81; 216/67; 356/316
See application file for complete search history.

(56) References Cited

U.S. PATENT DOCUMENTS

| | | | |
|---|---|---|---|
| 5,082,685 A | 1/1992 | Morooka | |
| 5,468,955 A | 11/1995 | Chen et al. | |
| 6,331,701 B1 * | 12/2001 | Chen et al. | ............. 250/251 |
| 6,503,050 B2 | 1/2003 | Reimer et al. | |
| 6,809,310 B2 * | 10/2004 | Chen | ............. 250/251 |
| 2007/0069118 A1 | 3/2007 | Chen et al. | |
| 2007/0221833 A1 | 9/2007 | Yeom et al. | |
| 2009/0090852 A1 * | 4/2009 | Chen et al. | ............. 250/251 |
| 2009/0095714 A1 * | 4/2009 | Chen et al. | ............. 216/67 |
| 2009/0236314 A1 * | 9/2009 | Chen | ............. 216/67 |

OTHER PUBLICATIONS

U.S. Office Action issued in U.S. Appl. No. 11/869,656 mailed Jan. 4, 2010.

* cited by examiner

*Primary Examiner*—Nikita Wells (57) ABSTRACT

Method and system for producing a neutral beam source is described. The neutral beam source comprises a plasma generation system for forming a first plasma in a first plasma region, a plasma heating system for heating electrons from the first plasma region in a second plasma region to form a second plasma, and a neutralizer grid for neutralizing ion species from the second plasma in the second plasma region. Furthermore, the neutral beam source comprises an electron acceleration member configured to accelerate the electrons from the first plasma region into the second plasma region. Further yet, the neutral beam source comprises a pumping system that enables use of the neutral beam source for semiconductor processing applications, such as etching processes.

25 Claims, 6 Drawing Sheets

MULTI-PLASMA NEUTRAL BEAM SOURCE AND METHOD OF OPERATING

CROSS-REFERENCE TO RELATED APPLICATIONS

This application is related to pending U.S. patent application Ser. No. 11/869,656, entitled "NEUTRAL BEAM SOURCE AND METHOD FOR PLASMA HEATING", filed on Oct. 9, 2007. The entire content of this application is herein incorporated by reference in its entirety.

BACKGROUND OF THE INVENTION

1. Field of the Invention

The invention relates to a method and system for operating a neutral beam source for treating a substrate and, more particularly, to a method and system for creating a neutral beam and pumping a processing system utilizing a neutral beam source.

2. Description of Related Art

During semiconductor processing, plasma is often utilized to assist etch processes by facilitating the anisotropic removal of material along fine lines or within vias (or contacts) patterned on a semiconductor substrate. Furthermore, plasma is utilized to enhance the deposition of thin films by providing improved mobility of adatoms on a semiconductor substrate.

For example, during dry plasma etching, a semiconductor substrate having an overlying patterned, protective layer, such as a photoresist layer, is positioned on a substrate holder in a plasma processing system. Once the substrate is positioned within the chamber, an ionizable, dissociative gas mixture is introduced, whereby the chemical composition is specially chosen for the specific material being etched on the semiconductor substrate. As the gas is introduced, excess gases are evacuated from the plasma processing system using a vacuum pump.

Thereafter, plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma.

The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide ($SiO_2$), low-k dielectric materials, poly-silicon, and silicon nitride.

However, the use of plasma (i.e., electrically charged particles), itself, produces problems in the manufacture of semiconductor devices. As devices have become smaller and integration densities have increased, breakdown voltages of insulation and isolation structures therein have, in many instances, been markedly reduced, often to much less than ten volts. For example, some integrated circuit (IC) device designs call for insulators of sub-micron thicknesses.

At the same time, the reduction of the size of structures reduces the capacitance value of the insulation or isolation structures, and relatively fewer charged particles are required to develop an electric field of sufficient strength to break down insulation or isolation structures. Therefore, the tolerance of semiconductor structures for the charge carried by particles impinging on them during the manufacturing process, such as a dry plasma etching process, has become quite limited and the structures for dissipating such charges during manufacture are sometimes required, often complicating the design of the semiconductor device.

While this problem could be avoided by performing processing with neutrally charged particles, the charge of an ion or electron is the only property by which the motion of these particles can be effectively manipulated and guided. Therefore, an ion must remain in a charged state until its trajectory can be established and the energy of the ion must be sufficient that its trajectory will remain unchanged when neutralized by an electron. Even then, the trajectory may be altered and the flux of a neutral beam can be severely depleted by collisions with other particles which may or may not have been neutralized and which may have trajectories which are not precisely parallel.

As a result of this need, neutral beam sources have been developed to produce a beam of neutrally charged particles of arbitrary energy which may be as low as a few electron volts and as large as tens of thousands of electron volts or larger.

SUMMARY OF THE INVENTION

The invention relates to a method and system for operating a neutral beam source for treating a substrate and, more particularly, to a method and system for creating a neutral beam and for pumping a processing system utilizing a neutral beam source.

The invention relates to a method and system for producing a neutral beam. A neutral beam source comprises a plasma generation system for forming a first plasma in a first plasma region, a plasma heating system for heating electrons from the first plasma region in a second plasma region to form a second plasma, and a neutralizer grid for neutralizing ion species from the second plasma in the second plasma region. Furthermore, the neutral beam source comprises an electron acceleration member configured to accelerate the electrons from the first plasma region into the second plasma region. Further yet, the neutral beam source comprises a pumping system that enables use of the neutral beam source for semiconductor processing applications, such as etching processes.

According to one embodiment, a processing system configured to treat a substrate is described. The processing system comprises a neutral beam source comprising: a beam chamber comprising a first plasma region configured to receive a first process gas at a first pressure and a second plasma region disposed downstream of the first plasma region and configured to receive the first process gas from the first plasma region at a second pressure; a first gas injection system coupled to the beam chamber and configured to introduce the first process gas to the first plasma region; a plasma generation system coupled to the beam chamber and configured to generate a first plasma in the first plasma region from the first process gas; a separation member disposed between the first plasma region and the second plasma region, wherein the separation member comprises one or more openings configured to allow transport of electrons from the first plasma region to the second plasma region; an electron acceleration member disposed between the first plasma region and the second plasma region; a plasma heating system coupled to the beam chamber and configured to heat the electrons in the second plasma region to form a second plasma; and a neutralizer grid coupled to an outlet of the neutral beam source and configured to neutralize a flow of ions from the second plasma through the neutralizer grid in order to form the neutral beam. Furthermore, the neutral beam source is configured to be coupled to a process chamber. The process chamber is configured to receive the neutral beam in a processing space, wherein the process chamber comprises a substrate holder configured to support the substrate and position the substrate for treatment by the neutral beam. Additionally, a vacuum pumping system is coupled to the process chamber and configured to pump the processing space in the process chamber, and is coupled to the neutral beam source and configured to pump the first plasma region or the second plasma region or both in the neutral beam source.

According to another embodiment, a method for treating a substrate with a neutral beam is described, comprising: disposing the substrate in a processing chamber configured to treat the substrate with the neutral beam; forming the neutral beam using a neutral beam source coupled to the processing chamber, wherein the forming comprises creating a first plasma in a first plasma region, transporting electrons from the first plasma in the first plasma region to a second plasma region, heating the electrons in the second plasma region, accelerating the electrons from the first plasma region to the second plasma region using an electric field, and neutralizing ions from the second plasma region; pumping the neutral beam source using a vacuum pumping system coupled to the neutral beam source; pumping the processing chamber using the vacuum pumping source coupled to the processing chamber; and exposing the substrate to the neutral beam.

DETAILED DESCRIPTION OF EXEMPLARY EMBODIMENTS

In the following description, to facilitate a thorough understanding of the invention and for purposes of explanation and not limitation, specific details are set forth, such as a particular geometry of the neutral beam source and the processing system and various descriptions of the system components. However, it should be understood that the invention may be practiced with other embodiments that depart from these specific details.

Nonetheless, it should be appreciated that, contained within the description are features which, notwithstanding the inventive nature of the general concepts being explained, are also of an inventive nature.

Figure 1:
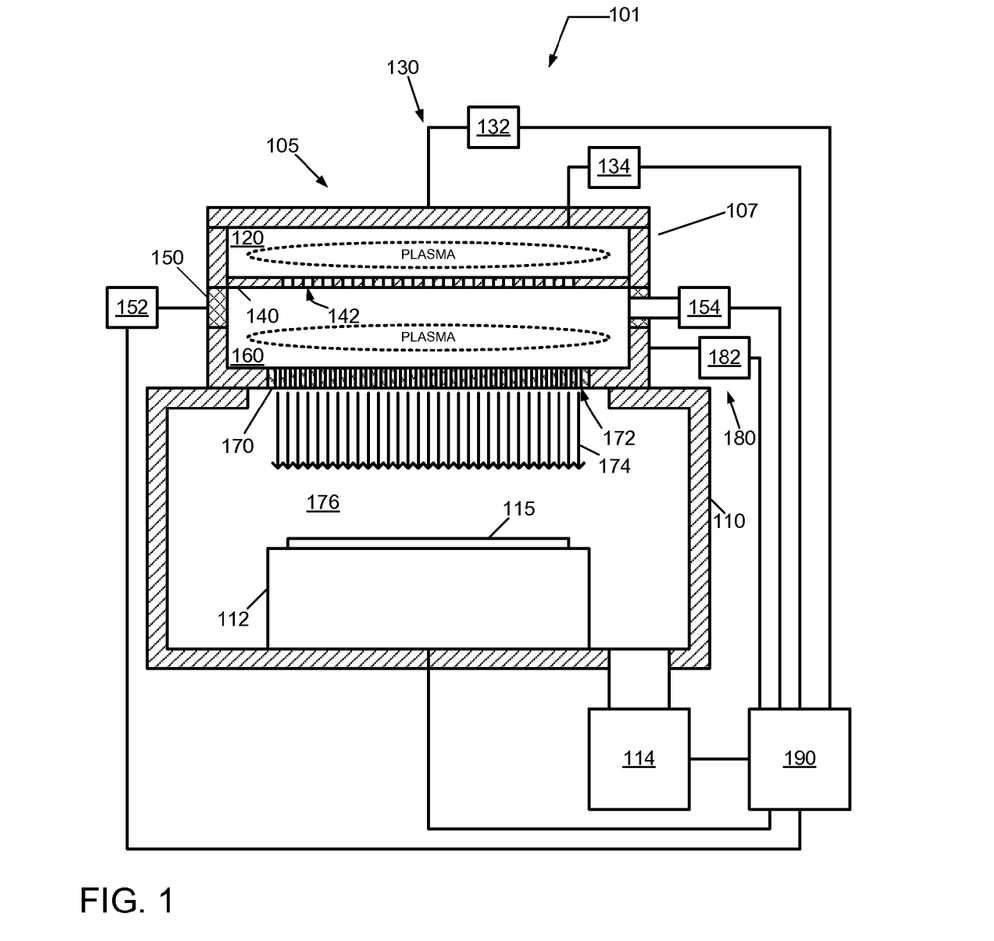
FIG. 1 shows a neutral beam source coupled to a processing system according to an embodiment.

Referring now to the drawings, wherein like reference numerals designate identical or corresponding parts throughout the several views, FIG. 1 depicts a processing system 101 comprising a neutral beam source 105 configured to produce a neutral beam 174, and a process chamber 110 configured to provide a contaminant-free, vacuum environment for processing a substrate 115 with the neutral beam 174. The process chamber 110 comprises a substrate holder 112 configured to support substrate 115, and a vacuum pumping system 114 coupled to the process chamber 110 and configured to evacuate the process chamber 110.

The neutral beam source 105 comprises a beam chamber 107 having a first plasma region 120 configured to receive a first process gas at a first pressure and form a first plasma. Furthermore, the beam chamber 107 comprises a second plasma region 160 disposed downstream of the first plasma region 120 and configured to receive electrons and the first process gas from the first plasma region 120 and form a second plasma therein at a second pressure.

A first gas injection system 134 is coupled to the beam chamber 107, and configured to introduce the first process gas to the first plasma region 120. The first process gas may comprise an electropositive gas or an electronegative gas or a mixture thereof. For example, the first process gas may comprise a noble gas, such as Ar. Additionally, for example, the first process gas may comprise any gas suitable for treating substrate 115. Furthermore, for example, the first process gas may comprise any gas having chemical constituents, atomic or molecular, suitable for treating substrate 115. The first gas injection system 134 may include one or more gas supplies or gas sources, one or more control valves, one or more filters, one or more mass flow controllers, etc.

An optional second gas injection system (not shown) may be coupled to the beam chamber 107, and configured to introduce a second process gas to the second plasma region 160. The second process gas may comprise any gas suitable for treating substrate 115. Additionally, for example, the second process gas may comprise any gas having chemical constituents, atomic or molecular, suitable for treating substrate 115. The second gas injection system may include one or more gas supplies or gas sources, one or more control valves, one or more filters, one or more mass flow controllers, etc.

According to one example, when producing an oxygen neutral beam, the first process gas may comprise $O_2$ with or without Ar. According to another example, when producing an oxygen neutral beam, the first process gas may comprise $O_2$ with or without Ar, and the second process gas may comprise $O_2$. According to yet another example, when producing an oxygen neutral beam, the first process gas may comprise Ar, and the second process gas may comprise $O_2$.

Referring still to FIG. 1, the neutral beam source 105 comprises a plasma generation system 130 coupled to the beam chamber 107 and configured to generate the first plasma in the first plasma region 120. The neutral beam source 105 further comprises a plasma heating system 180 coupled to the beam chamber 107 and configured to heat electrons from the first plasma region 120 to form the second plasma in the second plasma region 160.

The plasma generation system 130 can comprise a system configured to produce a capacitively coupled plasma (CCP), an inductively coupled plasma (ICP), a transformer coupled plasma (TCP), a surface wave plasma, a helicon wave plasma, or an electron cyclotron resonant (ECR) heated plasma, or other type of plasma understood by one skilled in the art of plasma formation.

For example, the plasma generation system 130 may comprise an inductive coil (not shown) which is coupled to power source 132. The power source 132 may comprise a radio frequency (RF) generator that couples RF power through an optional impedance match network to the inductive coil. RF power is inductively coupled from the inductive coil through a dielectric window (not shown) to plasma in the first plasma region 120. A typical frequency for the application of RF power to the inductive coil can range from about 10 MHz to about 100 MHz. In addition, a slotted Faraday shield (not shown) can be employed to reduce capacitive coupling between the inductive coil and plasma.

An impedance match network may serve to improve the transfer of RF power to plasma by reducing the reflected power. Match network topologies (e.g. L-type, π-type, T-type, etc.) and automatic control methods are well known to those skilled in the art.

The inductive coil may be a "spiral" coil or "pancake" coil in communication with the plasma from above as in a transformer coupled plasma (TCP). Alternatively, the inductive coil may include a helical coil. The design and implementation of an ICP source, or TCP source, is well known to those skilled in the art.

As an example, in an electropositive discharge, the electron density may range from approximately $10^{10}$ cm$^{-3}$ to $10^{13}$ cm$^{-3}$, and the electron temperature may range from about 1 eV to about 10 eV (depending on the type of plasma source utilized).

The plasma heating system 180 is configured to heat electrons from the first plasma region 120 in the second plasma region 160 by utilizing capacitively coupled plasma (CCP) technology, inductively coupled plasma (ICP) technology, transformer coupled plasma (TCP) technology, surface wave plasma technology, helicon wave plasma technology, or electron cyclotron resonant (ECR) heated plasma technology, or other type of plasma technology understood by one skilled in the art of plasma formation.

For example, the plasma heating system 180 may comprise an inductive coil (not shown) which is coupled to power source 182. The power source 182 may comprise a RF generator that couples RF power through an optional impedance match network to the inductive coil. RF power is inductively coupled from the inductive coil through a dielectric window (not shown) to plasma in the second plasma region 160. A typical frequency for the application of RF power to the inductive coil can range from about 10 MHz to about 100 MHz. In addition, a slotted Faraday shield (not shown) can be employed to reduce capacitive coupling between the inductive coil and plasma.

An impedance match network may serve to improve the transfer of RF power to plasma by reducing the reflected power. Match network topologies (e.g. L-type, π-type, T-type, etc.) and automatic control methods are well known to those skilled in the art.

Referring still to FIG. 1, a separation member 140 is disposed between the first plasma region 120 and the second plasma region 160, wherein the separation member 140 comprises one or more openings 142 configured to allow the passage of the first process gas as well as the transport of electrons from the first plasma in the first plasma region 120 to the second plasma region 160 in order to form the second plasma in the second plasma region 160. The one or more openings 142 in the separation member 140 may comprise super-Debye length apertures, i.e., the transverse dimension or diameter is larger than the Debye length. The one or more openings 142 may be sufficiently large to permit adequate electron transport, and the one or more openings 142 may be sufficiently small to prevent or reduce electron heating across the separation member 140. The one or more openings 142 may be sufficiently small to sustain a pressure difference between the first pressure in the first plasma region 120 and the second pressure in the second plasma region 160.

As illustrated in FIG. 1, electrons are transported from the first plasma region 120 to the second plasma region 160 through separation member 140. The neutral beam source 105 further comprises an electron acceleration member 150 disposed between the first plasma region 120 and the second plasma region 160, and configured to accelerate electrons from the first plasma region 120 to the second plasma region 160 via an electric field formed between the first plasma and the second plasma. The electron transport may be driven by diffusion, and it may be driven by field-enhanced diffusion via the imposed electric field between the first plasma and the second plasma.

Figure 2:
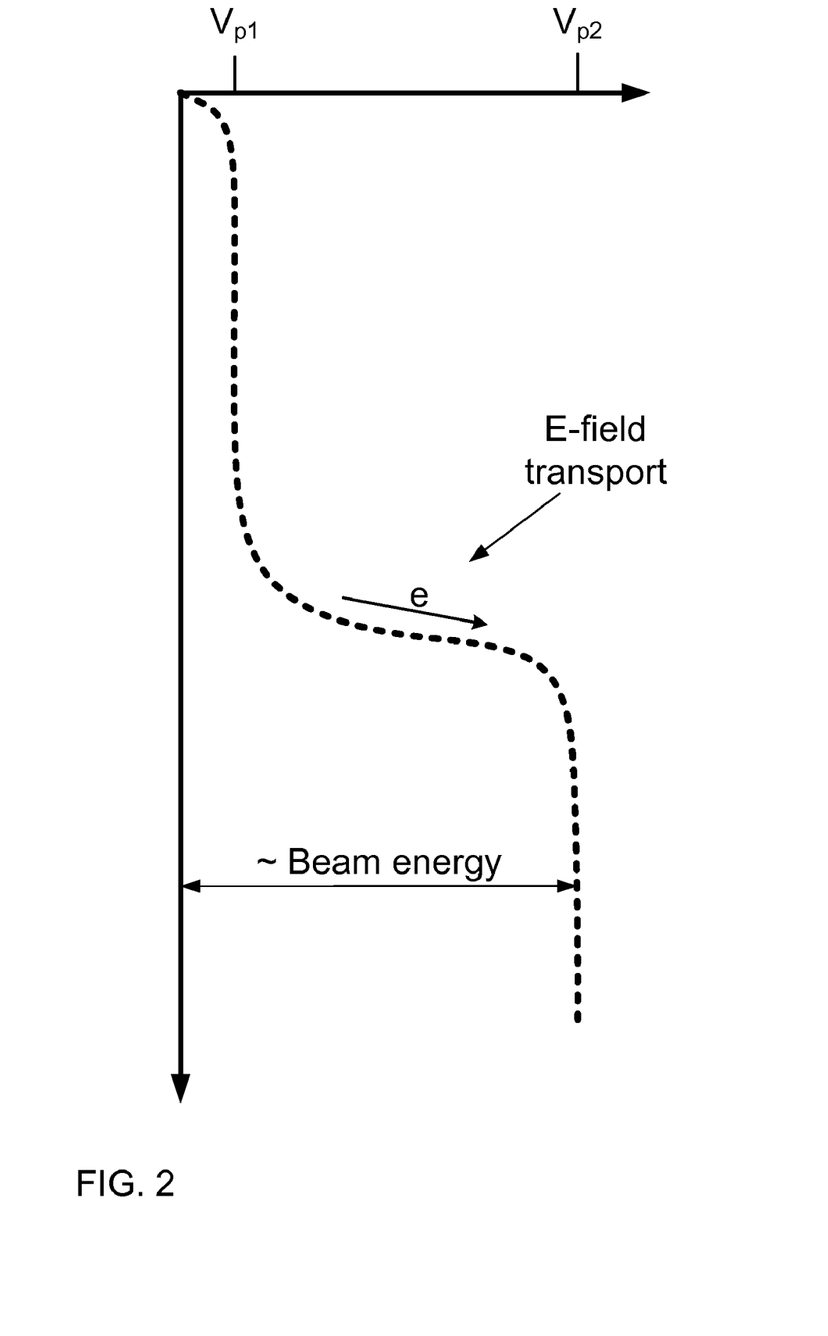
FIG. 2 illustrates an exemplary plasma potential for a neutral beam source according to an embodiment.

The electron acceleration member 150 may be configured to elevate the plasma potential of the second plasma in the second plasma region 160 relative to the plasma potential of the first plasma in the first plasma region 120 (see FIG. 2.). As a result in the difference between a first plasma potential ($V_{p,1}$) for the first plasma in the first plasma region 120 and a second plasma potential ($V_{p,2}$) for the second plasma in the second plasma region 160, the resulting electric field between the first plasma region 120 and the second plasma region 160 provide E-field transport of electrons (e$^-$) from the first plasma region 120 to the second plasma region 160. For example, the electron acceleration member 150 may comprise a voltage source 152 configured to elevate the second plasma potential for the second plasma.

As electrons emerge from the separation member 140 and enter the second plasma region 160, they are heated by plasma heating system 180. In this configuration, where electrons are fed from the first plasma region 120 to the second plasma region 160 and heated in the second plasma region 160, the second pressure may be low relative to the first pressure in the first plasma region 120. For example, the first pressure may be approximately an order of magnitude larger (e.g., 10 times greater (10×), 20×, 30×, etc.) than the second pressure. Additionally, for example, the first pressure may be selected for ease of plasma ignition and for efficient generation of plasma, while the second pressure is selected to be relatively low in order to reduce or minimize collisions in the second plasma region 160. Further yet, for example, the first pressure may range from about 10 mtorr (millitorr) to about 500 mtorr, e.g., about 10 mtorr to about 100 mtorr (e.g., 30 mTorr), while the second pressure may range from about 0.1 mtorr (millitorr) to about 10 mtorr, e.g., about 1 mtorr to about 10 mtorr (e.g., 3 mtorr).

Processing system 101 further comprises a neutralizer grid 170 coupled to an outlet of the process chamber 110, and configured to partly or fully neutralize ions from the second plasma region 160. The neutralizer grid 170 comprises one or more apertures 172 for neutralizing ion species as these species pass through. The neutralizer grid 170 may be coupled to ground or it may be electrically biased. The neutralizer grid 170 may be a sub-Debye neutralizer grid. The one or more apertures 172 may be, for instance, approximately 1 mm in diameter and 12 mm in length.

If the diameter (or transverse dimension(s)) of the one or more apertures 172 is on the order of or smaller than the Debye length (i.e., a sub-Debye dimension) and the aspect ratio (i.e., ratio of longitudinal dimension L to transverse dimension d) is maintained at approximately 1:1 or larger, then the geometry of the plasma sheath is substantially unaffected from the geometry which would be caused by an un-apertured neutralizer grid (i.e., a planar wall) and remains substantially planar.

Therefore, a region where ion and electron recombination are favored will exist adjacent to but not necessarily within the aperture and the number of energetic neutral particles will be made to increase relative to the ion population. Furthermore, plasma formed upstream of the neutralizer grid is confined and does not form a charged particle flux through the aperture. The flux of particles through the aperture, however, will also contain some effusive neutral beam component, although the effusive neutral beam component may be reduced by increasing the aspect ratio of the one or more apertures.

The neutralizer grid 170 may be fabricated from a conductive material or a non-conductive material. For example, the neutralizer grid 170 may be fabricated from $RuO_2$ or Hf. Additionally, for example, other materials may include silicon-containing materials, such as silicon, doped silicon, polycrystalline silicon, silicon carbide, silicon nitride, silicon oxide, quartz, etc. Furthermore, for example, the neutralizer grid 170 may be fabricated from a conductive material or a non-conductive material, and it may be coated with a protective barrier.

Additional details for a neutral beam source having a sub-Debye length neutralizer grid is provided in U.S. Pat. No. 5,468,955, entitled "Neutral beam apparatus for in-situ production of reactants and kinetic energy transfer".

As the neutral beam diameter increases, for example, from approximately one (1) inch to approximately thirteen (13) inches or greater (in order to process a 300 mm diameter substrate, or 450 mm diameter substrate, etc.), the diameter of the neutralizer grid 170 must increase to approximately thirteen (13) inches as well. One problem associated with a large diameter neutral beam is an increased gas-load. As the diameter of the neutralizer grid 170 is increased, the total gas conductance (for the thermal gas) of the neutralizer grid increases proportionally to the open area. Of course, the conductance of the individual high aspect-ratio sub-Debye opening remains constant.

As an example, one arrangement for pumping a neutral beam source is illustrated in FIG. 1. All of the atoms/molecules (thermal and hyperthermal) pass through neutralizer grid 170, and enter processing space 176 in process chamber 110. Vacuum pumping system 114 comprises a turbo-molecular pump (TMP), which is coupled to process chamber 110 in order to maximize the flow conductance between the inlet of the vacuum pump and processing space 176 (i.e., the region of substrate 115). The gas pressure of processing space 176 should be sufficiently low (e.g., <1 mtorr) in order to prevent collisions with the gas which would cause the neutral beam 174 to lose its directionality.

For example, a desirable pressure can be approximately $1\times10^{-4}$ Torr, or less. When the diameter of neutralizer grid 170 is approximately thirteen (13) inches, the net flow conductance through the separation member 140 and the neutralizer grid 170 is approximately 100 liters/second (l/sec). In order to achieve a pressure desirable for forming plasma in first plasma region 120 (i.e., 30 mtorr) and to achieve a pressure desirable for processing substrate 115 in processing space 176 (i.e., $1\times10^{-4}$ torr), the vacuum pumping system 114 would be required to deliver approximately 30,000 l/sec to processing space 176.

For instance, the throughput (measured as torr-l/sec) of gas passing through neutralizer grid 170 can be expressed as: $Q=C^*(P_1-P_2)$, where Q represents the gas throughput (torr-l/sec), C represents the flow conductance through the separation member 140 and the neutralizer grid 170 (l/sec), $P_1$ represents the gas pressure (torr) in the first plasma region 120, and $P_2$ represents the gas pressure (torr) in processing space 176. Additionally, the throughput can be represented as $Q=P_2S_2$, where $S_2$ represents the pumping speed delivered to the processing space 176 in order to achieve a gas pressure of $P_2$ for a throughput Q. Upon considering the conservation of mass, a steady flow requires that the two expressions for gas throughput be equivalent, hence, $P_2S_2=C^*(P_1-P_2)$, or $S_2=C^*(P_1-P_2)/P_2$. For the conditions stated above (i.e., C~100 l/sec, $P_1$~30 mtorr, and $P_2$~0.1 mtorr), the pumping speed $S_2$ delivered to processing space 176 must be at least 30,000 l/sec (which places greater demands on the vacuum pump or pumps if the flow conductance between processing space 176 and the inlet to the vacuum pump is not substantially larger than the pumping speed at the inlet to the vacuum pump).

The vacuum pumping system 114 may be coupled to the process chamber 110, as shown in FIG. 1, and configured to pump the processing space 176 in the process chamber 110. Optionally, the vacuum pumping system 114 may be coupled to the neutral beam source 105 and configured to pump the first plasma region 120 or the second plasma region 160 or both in the neutral beam source 105. For example, the vacuum pumping system 114 may comprise a vacuum pump coupled to the processing space 176 through a first exhaust duct and a first vacuum valve, and coupled to the first plasma region 120 or the second plasma region 160 or both through a second exhaust duct and a second vacuum valve.

Alternatively, as shown in FIG. 1, the vacuum pumping system 114 may comprise a first vacuum pump coupled to the processing space 176, and a second vacuum pump 154 coupled to the first plasma region 120 or the second plasma region 160 or both. As shown in FIG. 1, the second vacuum pump 154 may be coupled to the second plasma region 160. The first vacuum pump may be coupled to the processing space 176 through a first exhaust duct and a first vacuum valve, and the second vacuum pump 154 may be coupled to the first plasma region 120 or the second plasma region 160 or both through a second exhaust duct and a second vacuum valve.

Returning now to the example provided earlier (i.e., a flow conductance of approximately C~100 l/sec for neutralizer grid 170, a gas pressure of approximately $P_1$~30 mtorr in the first plasma region 120, and a gas pressure of approximately $P_2$~0.1 mtorr in processing space 176), the pumping speed of the first vacuum pump may, for instance, be approximately 3000 l/sec and the pumping speed of second vacuum pump may, for instance, be approximately 1000 l/sec.

It is desirable to minimize the (thermal) gas load through the neutralizer grid 170. Therefore, for example, the pumping speed delivered directly to the second plasma region 160 can be selected to be approximately ten (10) times greater than the flow conductance of the neutralizer grid 170. In this example, approximately 90% of the gas flow exiting from the second plasma region 160 is exhausted to the second vacuum pump while the remaining approximately 10% of the gas flow exiting from the second plasma region 160 is exhausted to the first vacuum pump. Since the gas load through the neutralizer grid 170 is reduced by approximately an order of magnitude, the requirement for the pumping speed delivered to the processing space 176 is lessened by an order of magnitude.

In continuing this example, if the pumping speed for the second vacuum pump 154 is selected to be approximately 1000 l/sec, then the flow conductance between the inlet of the second vacuum pump 154 and the second plasma region 160 should be sufficiently large such that the actual pumping speed delivered to the second plasma region 160 is substantially equivalent to the pumping speed at the inlet to the second vacuum pump 154. For instance, if the pumping speed at the inlet to the second vacuum pump 154 is $S_{inlet}=1000$ l/sec and the flow conductance (between the second vacuum pump and the plasma space) is $C_{plasma}=10,000$ l/sec, then the pumping speed delivered to the second plasma region 160 is:

$$S_{plasma}=S_{inlet}*C_{plasma}/(S_{inlet}+C_{plasma})=909 \; l/sec.$$

Alternatively, for instance, if the pumping speed at the inlet to the second vacuum pump 154 is $S_{inlet}=2000$ l/sec and the flow conductance (between the second vacuum pumping system and the plasma space) is $C_{plasma}=2000$ l/sec, then the pumping speed delivered to the second plasma region 160 is:

$$S_{plasma}=S_{inlet}*C_{plasma}/(S_{inlet}+C_{plasma})=1000 \; l/sec.$$

In order to provide a flow conductance of 10,000 l/sec, the height of one or more openings entering the second vacuum pump 154 may, for instance, be approximately 20 cm which, for a 40 cm diameter neutral beam source, gives a flow conductance of:

$$C_{opening} \sim 10*A_{opening}(cm^2)=25,133 \; l/sec,$$

and the cross-section of annular space 276 can be 50 cm by 50 cm which gives a flow conductance of:

$$C_{annular} \sim 10*A_{annular}(cm^2)=25,000, \text{ such that the total flow conductance becomes:}$$

$$C_{TOTAL} \sim C_{annular}*C_{opening}/(C_{annular}+C_{opening})=12,533 \; l/sec.$$

In yet another example, the neutral beam source can be configured to produce a divergent neutral beam. In a divergent neutral beam, the neutralizer grid flow conductance is larger than its sub-Debye counterpart. As a result, the vacuum pumping system 114 may be utilized to adjust the pumping speed delivered to processing space 176 and, hence, adjust the thermal neutral flux through the neutralizer grid 170 to processing space 176, which can, in turn, be utilized to adjust and/or control the process chemistry at the substrate surface.

Referring still to FIG. 1, processing system 101 can comprise a substrate temperature control system coupled to the substrate holder 112 and configured to adjust and control the temperature of substrate 115. The substrate temperature control system comprises temperature control elements, such as a cooling system including a re-circulating coolant flow that receives heat from substrate holder 112 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 112, as well as the chamber wall of the process chamber 110 and any other component within the processing system 101.

In order to improve the thermal transfer between substrate 115 and substrate holder 112, substrate holder 112 can include a mechanical clamping system, or an electrical clamping system, such as an electrostatic clamping system, to affix substrate 115 to an upper surface of substrate holder 112. Furthermore, substrate holder 112 can further include a substrate backside gas delivery system configured to introduce gas to the back-side of substrate 115 in order to improve the gas-gap thermal conductance between substrate 115 and substrate holder 112. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 115.

Referring still to FIG. 1, processing system 101 can further comprise a controller 190. Controller 190 comprises a microprocessor, memory, and a digital I/O port capable of generating control signals sufficient to communicate and activate inputs to processing system 101 as well as monitor outputs from processing system 101. Moreover, controller 190 can be coupled to and can exchange information with neutral beam source 105 including first gas injection system 134, optional second gas injection system, first power source 132, second power source 182, voltage source 152, neutralizer grid 170, substrate holder 112, and vacuum pumping system 114. For example, a program stored in the memory can be utilized to activate the inputs to the aforementioned components of processing system 101 according to a process recipe in order to perform the method of treating substrate 115.

However, the controller 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 190 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 190, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 190 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 190.

Controller 190 may be locally located relative to the processing system 101, or it may be remotely located relative to the processing system 101 via an internet or intranet. Thus, controller 190 can exchange data with the processing system 101 using at least one of a direct connection, an intranet, or the internet. Controller 190 may be coupled to an intranet at a customer site (i.e., a device maker, etc.), or coupled to an intranet at a vendor site (i.e., an equipment manufacturer). Furthermore, another computer (i.e., controller, server, etc.) can access controller 190 to exchange data via at least one of a direct connection, an intranet, or the internet.

Figure 3:
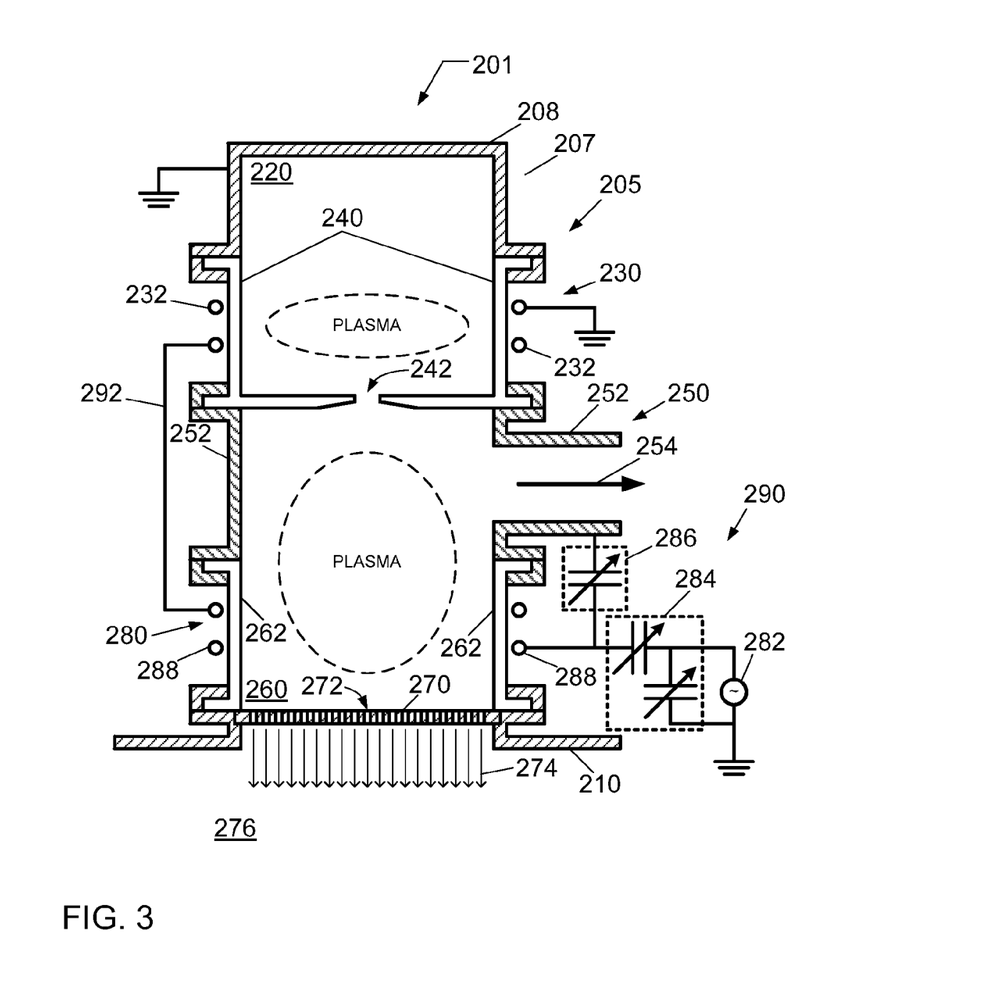
FIG. 3 presents a neutral beam source according to an embodiment.

Referring now to FIG. 3, wherein like reference numerals designate identical or corresponding parts throughout the several views, a processing system 201 comprising a neutral beam source 205 configured to produce a neutral beam 274 and configured to couple with a processing chamber 210 is provided according to an embodiment of the invention.

The neutral beam source 205 comprises a beam chamber 207 having a first plasma region 220 configured to receive a first process gas at a first pressure and form a first plasma. Furthermore, the beam chamber 207 comprises a second plasma region 260 disposed downstream of the first plasma region 220 and configured to receive electrons and the first process gas from the first plasma region 220 and form a second plasma therein at a second pressure.

A first gas injection system (not shown) is coupled to the beam chamber 207, and configured to introduce the first process gas to the first plasma region 220. The first process gas may comprise an electropositive gas or an electronegative gas or a mixture thereof. For example, the first process gas may comprise a noble gas, such as Ar. Additionally, for example, the first process gas may comprise any gas suitable for treating a substrate. Furthermore, for example, the first process gas may comprise any gas having chemical constituents, atomic or molecular, suitable for treating the substrate. The first gas injection system may include one or more gas supplies or gas sources, one or more control valves, one or more filters, one or more mass flow controllers, etc.

An optional second gas injection system (not shown) may be coupled to the beam chamber 207, and configured to introduce a second process gas to the second plasma region 260. The second process gas may comprise any gas suitable for treating the substrate. Additionally, for example, the second process gas may comprise any gas having chemical constituents, atomic or molecular, suitable for treating substrate 115. The second gas injection system may include one or more gas supplies or gas sources, one or more control valves, one or more filters, one or more mass flow controllers, etc.

According to one example, when producing an oxygen neutral beam, the first process gas may comprise $O_2$ with or without Ar. According to another example, when producing an oxygen neutral beam, the first process gas may comprise $O_2$ with or without Ar, and the second process gas may comprise $O_2$. According to yet another example, when producing an oxygen neutral beam, the first process gas may comprise Ar, and the second process gas may comprise $O_2$.

Referring still to FIG. 3, the neutral beam source 205 comprises a plasma generation system 230 coupled to the beam chamber 207 and configured to generate the first plasma in the first plasma region 220. The neutral beam source 205 further comprises a plasma heating system 280 coupled to the beam chamber 207 and configured to heat electrons from the first plasma region 220 to form the second plasma in the second plasma region 260.

As shown in FIGS. 2 and 3, the plasma generation system 230 is configured to form the first plasma in the first plasma region 220 at a first plasma potential ($V_{p,1}$), and the plasma heating system 280 heats the second plasma in the second plasma region 260 at a second plasma potential ($V_{p,2}$) greater than the first plasma potential. The first plasma is formed by coupling power, such as radio frequency (RF) power, to an ionizable gas in the first plasma region 220 of the beam chamber 210, while the second plasma is formed using electron flux (e.g., energetic electron (ee) current, $j_{ee}$) from the first plasma.

The first plasma may be heated by any conventional plasma generation system including, but not limited to, an inductively coupled plasma (ICP) source, a transformer coupled plasma (TCP) source, a capacitively coupled plasma (CCP) source, an electron cyclotron resonance (ECR) source, a helicon wave source, a surface wave plasma source, a surface wave plasma source having a slotted plane antenna, etc. Although the first plasma may be heated by any plasma source, it is desired that the first plasma is heated by a method that produces a reduced or minimum fluctuation in its plasma potential $V_{p,1}$. For example, an ICP source is a practical technique that produces a reduced or minimum $V_{p,1}$ fluctuation.

Additionally, the beam chamber 207 comprises a direct current (DC) conductive ground electrode 208 having a conductive surface that acts as a boundary in contact with the first plasma in the first plasma region 220. The DC conductive ground electrode 208 is coupled to DC ground. The DC conductive ground electrode 208 acts as an ion sink that is driven by the first plasma at the first plasma potential ($V_{p,1}$). Although one DC conductive ground electrode 208 is shown in FIG. 3, the processing system 201 may comprise one or more DC conductive ground electrodes.

Although not necessary, it is desirable that the DC conductive ground electrode 208 comprises a relatively large area in contact with the first plasma. The larger the area at DC ground, the lower the first plasma potential. For example, the surface area of the conductive surface for the DC conductive ground electrode 208 in contact with the first plasma may be greater than any other surface area in contact with the first plasma. Additionally, for example, the surface area of the conductive surface for the DC conductive ground electrode 208 in contact with the first plasma may be greater than the total sum of all other conductive surfaces that are in contact with the first plasma. Alternatively, as an example, the conductive surface for the DC conductive ground electrode 208 in contact with the first plasma may be the only conductive surface that is in contact with the first plasma. The DC conductive ground electrode 208 may offer the lowest impedance path to ground.

As described above, (energetic) electron flux (or electron current $j_{ee}$) from the first plasma initiates the second plasma in the second plasma region 260. In order to control the electron flux, the first plasma potential ($V_{p,1}$), as described above, and the second plasma potential ($V_{p,2}$) should be stable with substantially reduced or minimal fluctuations if any fluctuations at all. To achieve this stability in the second plasma, the neutral beam source 205 comprises an electron acceleration member 250. The electron acceleration member 250 comprises a conductive bias electrode 252 having a conductive surface in contact with the second plasma, wherein the conductive bias electrode 252 is coupled to a power system 290 configured to provide a voltage source. The voltage source is configured to couple a DC voltage or a radio frequency (RF) voltage to the at least one conductive bias electrode 252.

As a result, the second plasma potential ($V_{p,2}$) is a boundary-driven plasma potential driven by the voltage source, thus causing $V_{p,2}$ to rise to above the first plasma potential and remain substantially stable. Although one conductive bias electrode 252 is shown in FIG. 3, the processing system 201 may comprise one or more conductive bias electrodes 252.

Additionally, as shown in FIG. 3, the electron acceleration member 250 may serve as a pumping manifold for flowing exhaust 254 from the second plasma region 260 to a vacuum pumping system.

Furthermore, the plasma processing system comprises a separation member 240 disposed between the first plasma region 220 and the second plasma region 260. The separation member 240 may act as an electron diffuser. The electron diffusion is driven by an electric field through an electron acceleration layer created by the potential difference $\Delta V = V_{p,2} - V_{p,1}$. The separation member 240 may comprise an insulator, such as quartz or alumina, or the separation member 240 may comprise a dielectric coated conductive material that is electrically floating and has a high RF impedance to ground. Due to the large electric field across the electron acceleration layer ($\nabla_z(V_{p,2} - V_{p,1})$), the electron flux is sufficiently energetic to cause ionization in the second plasma. However, the processing system 201 further comprises plasma heating system 280 configured to further heat the second plasma.

The separation member 240 may comprise one or more openings 242 to permit the passage of the energetic electron flux from the first plasma region 220 to the second plasma region 260. The total area of the one or more openings can be adjusted relative to the surface area of the DC conductive ground electrode 208 to ensure a relatively large potential difference $\Delta V = V_{p,2} - V_{p,1}$ while minimizing reverse ion current from the second plasma to the first plasma, and thereby ensure a sufficient energy for neutral species striking the substrate.

The neutral beam source 205 further comprises a neutralizer grid 270 coupled to an outlet of the beam chamber 210, and configured to partly or fully neutralize ions from the second plasma region 260. The neutralizer grid 270 comprises one or more apertures 272 for neutralizing ion species as these species pass through. The neutralizer grid 270 may be coupled to ground or it may be electrically biased. The neutralizer grid 270 may be a sub-Debye neutralizer grid. The one or more apertures 272 may be, for instance, approximately 1 mm in diameter and 12 mm in length.

If the diameter (or transverse dimension(s)) of the one or more apertures 272 is on the order of or smaller than the Debye length (i.e., a sub-Debye dimension) and the aspect ratio (i.e., ratio of longitudinal dimension L to transverse dimension d) is maintained at approximately 1:1 or larger, then the geometry of the plasma sheath is substantially unaffected from the geometry which would be caused by an un-apertured neutralizer grid (i.e., a planar wall) and remains substantially planar.

Therefore, a region where ion and electron recombination are favored will exist adjacent to but not necessarily within the aperture and the number of energetic neutral particles will be made to increase relative to the ion population. Furthermore, plasma formed upstream of the neutralizer grid is confined and does not form a charged particle flux through the aperture. The flux of particles through the aperture, however, will also contain some effusive neutral beam component, although the effusive neutral beam component may be reduced by increasing the aspect ratio of the one or more apertures.

The neutralizer grid 270 may be fabricated from a conductive material or a non-conductive material. For example, the neutralizer grid 270 may be fabricated from $RuO_2$ or Hf. Additionally, for example, other materials may include silicon-containing materials, such as silicon, doped silicon, polycrystalline silicon, silicon carbide, silicon nitride, silicon oxide, quartz, etc. Furthermore, for example, the neutralizer grid 270 may be fabricated from a conductive material or a non-conductive material, and it may be coated with a protective barrier.

As illustrated in FIG. 3, a first ion flux (e.g., ion current, $j_{i1}$) from a first population of ions in the first plasma flows to the DC conductive ground electrode 208 in the first plasma region 220 in a quantity approximately equivalent to the energetic electron flux (or electron current $j_{ee}$) from the first plasma through the separation member 240 into the second plasma, i.e., $j_{i1} \sim j_{ee}$.

As described above, the energetic electron flux is sufficiently energetic to form the second plasma. Therein, a population of thermal electrons and a second population of ions are formed. The thermal electrons are largely a result of ejected electrons upon ionization of the second plasma by the incoming energetic electron flux (or electron current $j_{ee}$) and the plasma heating system 280. However, some energetic electrons from the energetic electron flux may lose a sufficient amount of energy and, thus, become part of the thermal electron population.

Due to Debye shielding, only the thermal electrons of the second plasma flow to the conductive bias electrode 252 (e.g., thermal electron current, $j_{te}$) in a quantity approximately equal to the energetic electron flux, i.e., $j_{te} \sim j_{ee}$. While thermal electron current $j_{te}$ is directed to the conductive bias electrode 252, a second ion flux from the second population of ions is directed to the neutralizer grid 270 at $V_{p,2}$ (as ion current, $j_{i2}$).

If the incoming energetic electron energy is sufficiently high, a substantial fraction of the energetic electron flux ($j_{ee}$) will survive the passage through the second plasma and neutralize the second ion flux at the neutralizer grid 270, thus, forming neutral beam 274 through one or more apertures 272 in the neutralizer grid 270. Since the neutralizer grid 270 may be at floating DC ground, the ion current $j_{i2}$ that is fed by the second ion population in the second plasma may be approximately equivalent to the electron current $j_{e2}$ (i.e., no net current, or $j_{i2} \sim j_{e2}$). Alternatively, the neutralizer grid 270 may be at approximately DC ground since the floating-ground surface potential is expected to be slightly above DC ground.

In such a configuration for the processing system 201, the elevation of the second plasma potential above the first plasma potential drives an energetic electron beam (having electron current $j_{ee}$) to form the second plasma, while particle balance throughout the neutral beam source 205 enforces an equal number of electrons (e.g., electron current, $j_{e2}$) and ions (e.g., ion current, $j_{i2}$) arriving at the neutralizer grid 270 (i.e., $j_{i2} \sim j_{e2}$). This charge balance manifests as neutral beam 274 directed to the substrate in the process chamber 210.

Referring still to FIG. 3, power system 290 is utilized to couple power to the first plasma in the first plasma region 220, to couple power to the second plasma in the second plasma region 260, and provide the voltage source to couple a voltage to the electron acceleration member 250. According to one embodiment, the power system 290 comprises a RF power source 282 configured to couple RF power to the first plasma using a first inductive coil 232 surrounding a first dielectric member 240 and couple RF power to the second plasma using a second inductive coil 288 surrounding a second dielectric member 262.

As illustrated in FIG. 3, RF power is coupled to a first end of the second inductive coil 288 through an impedance match network 284. The impedance match network 284 may comprise one or more variable capacitors, variable inductors, non-variable capacitors, or non-variable inductors, or any combination thereof. For example, the impedance match network 284 may include an L-type match network topology. However, other types of topologies (e.g., pi-type, T-type, etc.) may be used as is understood by one skilled in the art of RF circuits.

RF power is coupled from the second inductive coil 288 to the first inductive coil 232 via an interconnect circuit 292. The interconnect circuit 292 couples a second end of the second inductive coil 288 to a first end of the first inductive coil 232. The interconnect circuit 292 may include a direct electrical connection; however, it may include any electrical circuit element, such as one or more capacitors, or one or more inductors, or a combination thereof, each of which may be connected with one another in series or parallel or both and which may be variable or non-variable. A second end of the first inductive coil 232 may be coupled to electrical ground. However, this connection to ground may include any electrical circuit element, such as one or more capacitors, or one or more inductors, or a combination thereof, each of which may be connected with one another in series or parallel or both and which may be variable or non-variable.

As described above, RF power may be inductively coupled from the first inductive coil 232 through the first dielectric member 240 to the first plasma in the first plasma region 220. In addition to permitting RF transmission to the first plasma, the first dielectric member 240 may, among other things, maintain vacuum integrity for the neutral beam source 205 and provide electrical insulation between the at least one DC conductive ground electrode 208 and the electron acceleration member 250. Further, as described above, RF power may be inductively coupled from the second inductive coil 288 through the second dielectric member 262 to the second plasma in the second plasma region 260. In addition to permitting RF transmission to the second plasma, the second dielectric member 262 may, among other things, maintain vacuum integrity for the neutral beam source 205 and provide electrical insulation between the neutralizer grid 270 and the electron acceleration member 250.

Although, the order of RF power transmission illustrated in FIG. 3 flows from the RF power source 282 to the second inductive coil 288 to the first inductive coil 232, the order may be reversed. Alternatively, RF power may be coupled to the first inductive coil 232 and the second inductive coil 288 in parallel with one another.

Furthermore, as shown in FIG. 3, RF voltage may be coupled to the one or more conductive bias electrodes 252 of electron acceleration member 250 through a bias interconnect circuit 286. The bias interconnect circuit 286 may include a direct electrical connection; however, it may include any circuit element, such as one or more capacitors, or one or more inductors, or a combination thereof, each of which may be connected with one another in series or parallel or both and which may be variable or non-variable.

Figure 4:
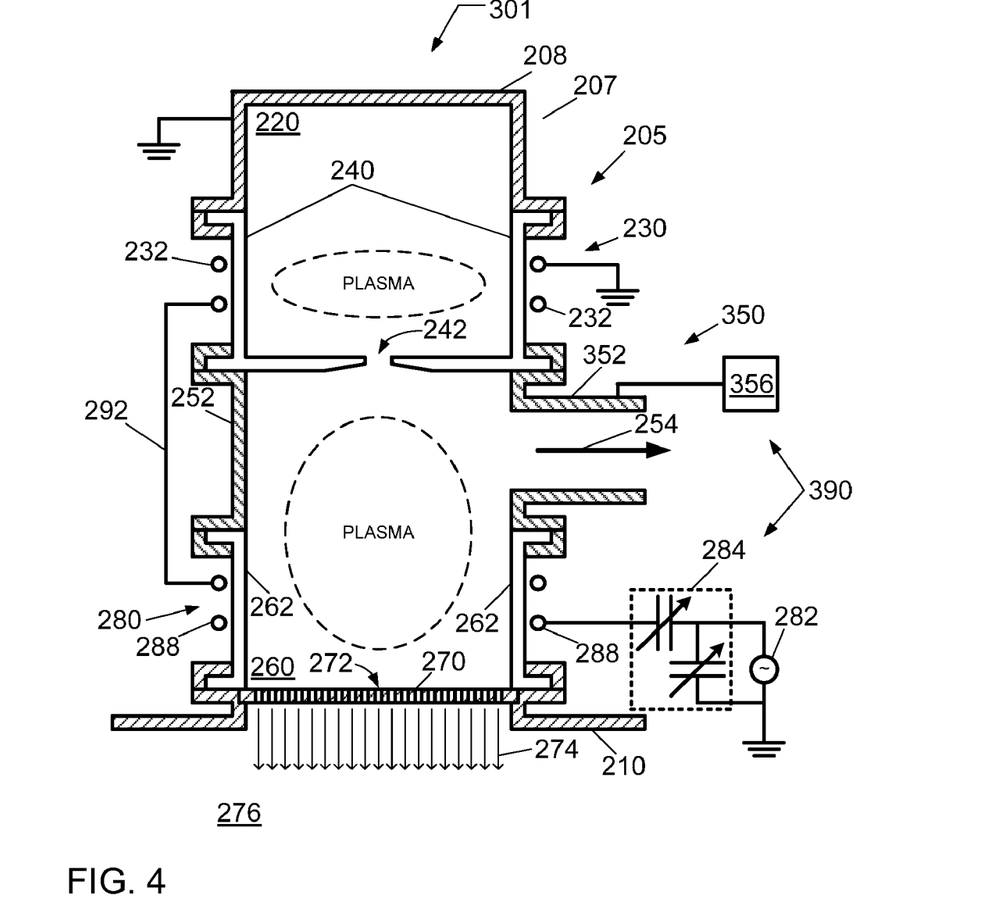
FIG. 4 presents a neutral beam source according to another embodiment.

Referring now to FIG. 4, wherein like reference numerals designate identical or corresponding parts throughout the several views, a processing system 301 comprising a neutral beam source 305 configured to produce neutral beam 274 and configured to couple with processing chamber 210 is provided according to another embodiment of the invention.

The neutral beam source 305 comprises an electron acceleration member 350. The electron acceleration member 350 comprises a conductive bias electrode 352 having a conductive surface in contact with the second plasma, wherein the conductive bias electrode 352 is coupled to a power system 390 having voltage source 356. The voltage source 356 is configured to independently couple a DC voltage or a radio frequency (RF) voltage to the at least one conductive bias electrode 352.

Figure 5:
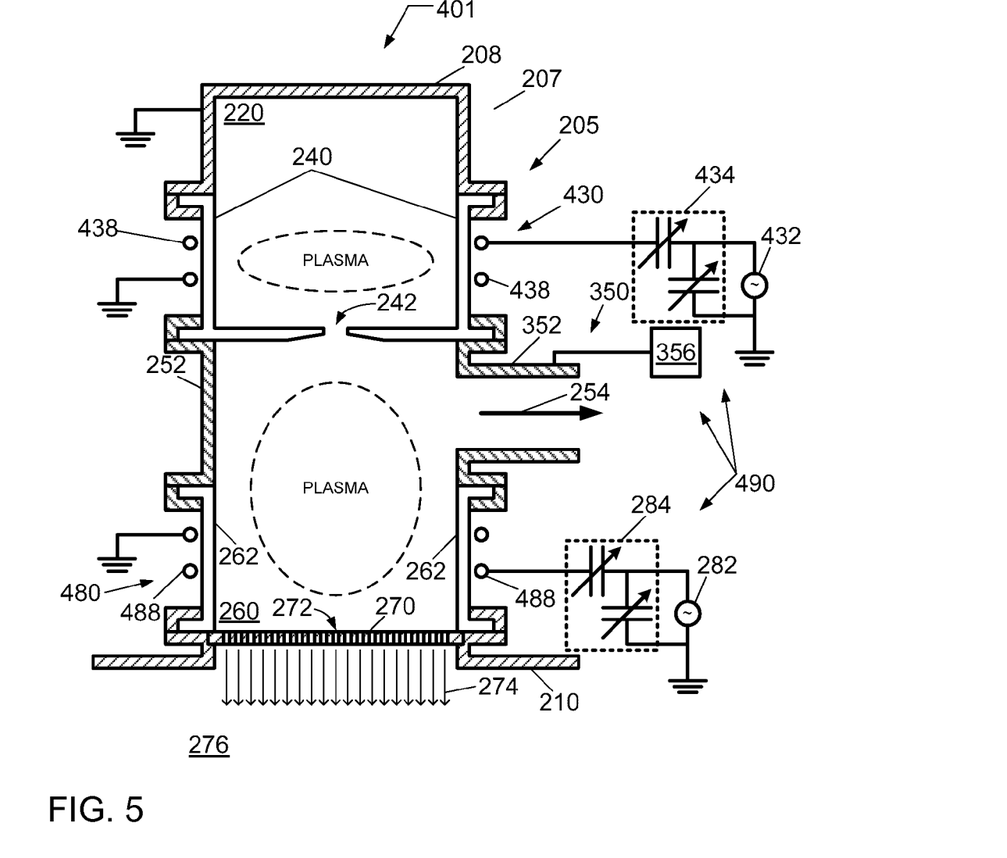
FIG. 5 presents a neutral beam source according to yet another embodiment.

Referring now to FIG. 5, wherein like reference numerals designate identical or corresponding parts throughout the several views, a processing system 401 comprising a neutral beam source 405 configured to produce neutral beam 274 and configured to couple with processing chamber 210 is provided according to yet another embodiment of the invention.

As illustrated in FIG. 5, RF power is coupled to a first inductive coil 432 and a second inductive coil 488. A power system 490 independently couples a first RF power to a first end of a first inductive coil 438 of plasma generation system 430. The first RF power may be provided from another RF power source 432 through another impedance match network 434. Additionally, the power system 490 independently couples a second RF power to a first end of second inductive coil 488 of plasma heating system 480. The second end of the first inductive coil 438 may be coupled to electrical ground. The second end of the second inductive coil 488 may be coupled to electrical ground. These connections to ground may include any circuit element, such as one or more capacitors, or one or more inductors, or a combination thereof, each of which may be connected with one another in series or parallel or both and which may be variable or non-variable.

Figure 6:
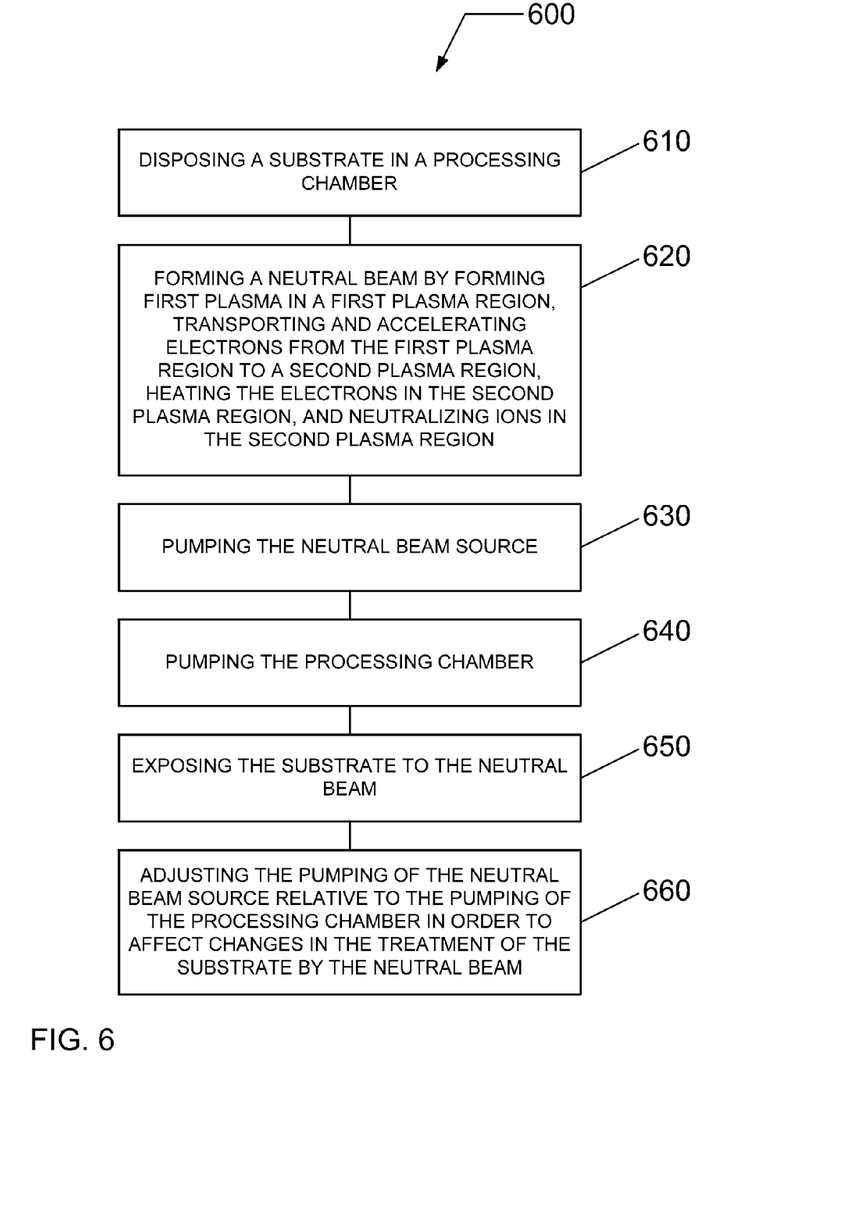
FIG. 6 illustrates a method of operating a neutral beam source coupled to a processing system configured to treat a substrate according to an embodiment.

Referring now to FIG. 6, a flow chart 600 of a method for operating a processing system utilizing a neutral beam source to treat a substrate according to an embodiment of the invention. Flow chart 600 begins in 610 with disposing a substrate in a processing chamber configured to facilitate the treatment of the substrate using a neutral beam.

In 620, a neutral beam is formed using a neutral beam source coupled to the processing chamber. The neutral beam can be provided using a neutral beam source as described in FIGS. 1 through 5. For example, a neutral beam is generated by forming a first plasma in a first plasma region, transporting and accelerating electrons from the first plasma in the first plasma region to a second plasma region, heating the electrons in the second plasma region, and neutralizing ions from the second plasma region.

In 630, a fraction of the gaseous medium in the neutral beam source is pumped by a vacuum pumping system. In 640, gases entering the processing chamber from the neutral beam source are pumped by another vacuum pumping system. The vacuum pumping system utilized to pump the neutral beam source and the other vacuum pumping system utilized to pump the processing chamber may utilize the same vacuum pump, or they may utilize independent vacuum pumps.

In 650, the substrate is exposed to the neutral beam that exits the neutral beam source and enters the processing chamber in order to treat the substrate. In 660, the pumping speed delivered to the neutral beam source is adjusted relative to the pumping speed delivered to the processing chamber in order to affect changes in the treatment of the substrate. For example, the pumping speed delivered to the neutral beam source can be reduced relative to the pumping speed delivered to the processing chamber in order to affect an increase in the neutral flux to the substrate. Conversely, the pumping speed delivered to the neutral beam source can be increased relative to the pumping speed delivered to the processing chamber in order to affect a reduction in the neutral flux to the substrate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A processing system configured to treat a substrate, comprising:
   a neutral beam source comprising:
      a beam chamber comprising a first plasma region configured to receive a first process gas at a first pressure and a second plasma region disposed downstream of said first plasma region and configured to receive said first process gas from said first plasma region at a second pressure,
      a first gas injection system coupled to said beam chamber and configured to introduce said first process gas to said first plasma region,
      a plasma generation system coupled to said beam chamber and configured to generate a first plasma in said first plasma region from said first process gas,
      a separation member disposed between said first plasma region and said second plasma region, wherein said separation member comprises one or more openings configured to allow transport of electrons from said first plasma region to said second plasma region,
      an electron acceleration member disposed between said first plasma region and said second plasma region,
      a plasma heating system coupled to said beam chamber and configured to heat said electrons in said second plasma region to form a second plasma, and
      a neutralizer grid coupled to an outlet of said neutral beam source and configured to neutralize a flow of ions from said second plasma through said neutralizer grid in order to form said neutral beam;
   a process chamber coupled to said neutral beam source and configured to receive said neutral beam in a processing space, wherein said process chamber comprises a substrate holder configured to support said substrate and position said substrate for treatment by said neutral beam; and
   a vacuum pumping system coupled to said process chamber and configured to pump said processing space in said process chamber, and coupled to said neutral beam source and configured to pump said first plasma region or said second plasma region or both in a neutral beam source.

2. The processing system of claim 1, further comprising: a second gas injection system coupled to said process chamber and configured to introduce a second process gas to said second plasma region.

3. The processing system of claim 1, wherein said plasma generation system comprises an inductive coil configured to inductively couple power from a power source to said first process gas in said first plasma region.

4. The processing system of claim 1, wherein said beam chamber comprises at least one direct current (DC) conductive ground electrode having a conductive surface in contact with said first plasma, and wherein said at least one DC conductive ground electrode is coupled to DC ground.

5. The processing system of claim 4, wherein said at least one DC conductive ground electrode comprises a doped silicon electrode.

6. The processing system of claim 4, wherein said conductive surface of said at least one DC conductive ground electrode comprises a surface area in contact with said first plasma greater than any other surface area in contact with said first plasma.

7. The processing system of claim 1, wherein said separation member is composed of a dielectric material.

8. The processing system of claim 1, wherein one or more of said one or more openings in said separation member comprises a diameter greater than or equal to a Debye length.

9. The processing system of claim 1, wherein said electron acceleration member comprises at least one conductive bias electrode having a conductive surface in contact with said second plasma, and wherein said at least one conductive bias electrode is coupled to a DC voltage source or a radio frequency (RF) voltage source.

10. The processing system of claim 9, wherein said at least one conductive bias electrode comprises a doped silicon electrode.

11. The processing system of claim 9, wherein said DC voltage source is configured to bias said at least one conductive bias electrode with a DC voltage ranging from about 50 V to about 5000V.

12. The processing system of claim 1, wherein said vacuum pumping system comprises a vacuum pump coupled to said processing space through a first exhaust duct and a first vacuum valve and coupled to said first plasma region or said second plasma region or both through a second exhaust duct and a second vacuum valve.

13. The processing system of claim 1, wherein said vacuum pumping system comprises a first vacuum pump coupled to said processing space, and a second vacuum pump coupled to said first plasma region or said second plasma region or both.

14. The processing system of claim 13, wherein said first vacuum pump is coupled to said processing space through a first exhaust duct and a first vacuum valve, and said second vacuum pump is coupled to said first plasma region or said second plasma region or both through a second exhaust duct and a second vacuum valve.

15. The processing system of claim 1, wherein said neutral beam source further comprises a pumping manifold disposed between said neutral beam source and said vacuum pumping system, said pumping manifold is configured to receive gases from said first plasma region or said second plasma region or both through at least one opening in said neutral beam source and exhaust said gases through an exhaust duct to said vacuum pumping system.

16. The processing system of claim 15, wherein said pumping manifold surrounds a periphery of said neutral beam source.

17. The processing system of claim 15, wherein:
   said pumping manifold surrounds said second plasma region,
   said electron acceleration member comprises at least one conductive bias electrode having a conductive surface in contact with said second plasma,
   said at least one conductive bias electrode is partly or fully integrated with said pumping manifold, and
   said at least one conductive bias electrode is coupled to a DC voltage source or a radio frequency (RF) voltage source.

18. The processing system of claim 1, wherein said plasma heating system comprises a second power source configured to couple second power to electrons transported to said second plasma region from said first plasma region.

19. The processing system of claim 18, wherein said plasma heating system comprises a second inductive coil configured to inductively couple electrical power to said electrons in said second plasma region.

20. The processing system of claim 1, further comprising: a controller coupled to said neutral beam source, said processing chamber, and said vacuum pumping system, and configured to adjust or control said neutral beam by varying at least one of a first power coupled by said plasma generation system to said neutral beam source, a second power coupled by said plasma heating system to said neutral beam source, a composition of said first process gas coupled to said neutral beam source, a flow rate of said first process gas coupled to said neutral beam source, a first pumping speed coupled to said process chamber, a second pumping speed coupled to said neutral beam source, or a temperature of said substrate, or a combination of one or more thereof.

21. The processing system of claim 1, wherein said neutralizer grid comprises a plurality of openings through which ions from said second plasma region enter and said neutral beam exits.

22. The processing system of claim 21, wherein one or more of said plurality of openings comprises a diameter less than or equal to a Debye length.

23. The processing system of claim 1, wherein said neutralizer grid is electrically grounded.

24. A neutral beam source configured to be coupled with a process chamber for treating a substrate, comprising:
 a beam chamber comprising a first plasma region configured to receive a first process gas at a first pressure and a second plasma region disposed downstream of said first plasma region and configured to receive said first process gas from said first plasma region at a second pressure;
 a first gas injection system coupled to said beam chamber and configured to introduce said first process gas to said first plasma region;
 a plasma generation system coupled to said beam chamber and configured to generate a first plasma in said first plasma region from said first process gas;
 a separation member disposed between said first plasma region and said second plasma region, wherein said separation member comprises one or more openings configured to allow transport of electrons and said first process gas from said first plasma region to said second plasma region;
 an electron acceleration member disposed between said first plasma region and said second plasma region;
 a plasma heating system coupled to said beam chamber and configured to heat said electrons in said second plasma region to form a second plasma; and
 a neutralizer grid coupled to an outlet of said neutral beam source and configured to neutralize a flow of ions from said second plasma through said neutralizer grid in order to form a neutral beam.

25. A method for treating a substrate with a neutral beam, comprising:
 disposing said substrate in a processing chamber configured to treat said substrate with said neutral beam;
 forming said neutral beam using a neutral beam source coupled to said processing chamber, wherein said forming comprises creating a first plasma in a first plasma region, transporting electrons from said first plasma in said first plasma region to a second plasma region, accelerating said electrons from said first plasma region to said second plasma region using an electric field, heating said electrons in said second plasma region, and neutralizing ions from said second plasma region;
 pumping said neutral beam source using a vacuum pumping system coupled to said neutral beam source;
 pumping said processing chamber using said vacuum pumping system coupled to said processing chamber; and
 exposing said substrate to said neutral beam.

* * * * *